United States Patent [19]

Bashir et al.

[11] Patent Number: 5,683,932
[45] Date of Patent: *Nov. 4, 1997

[54] METHOD OF FABRICATING A PLANARIZED TRENCH AND FIELD OXIDE ISOLATION STRUCTURE

[75] Inventors: Rashid Bashir, Santa Clara; Francois Hébert, Sunnyvale; Datong Chen, Fremont, all of Calif.

[73] Assignee: National Semiconductor Corporation, Santa Clara, Calif.

[*] Notice: The term of this patent shall not extend beyond the expiration date of Pat. No. 5,411,913.

[21] Appl. No.: 516,625

[22] Filed: Aug. 18, 1995

Related U.S. Application Data

[63] Continuation-in-part of Ser. No. 212,967, Mar. 15, 1994, abandoned.

[51] Int. Cl.⁶ .................................................. H01L 21/76
[52] U.S. Cl. .................................................. 437/67; 437/924
[58] Field of Search .................... 437/67, 924, 228 M, 437/228 TR; 148/DIG. 85, DIG. 86, DIG. 50

[56] References Cited

U.S. PATENT DOCUMENTS

| | | |
|---|---|---|
| 4,472,240 | 9/1984 | Toshiba . |
| 5,385,861 | 1/1995 | Bashir et al. . |
| 5,411,913 | 5/1995 | Bashir et al. . |

FOREIGN PATENT DOCUMENTS

| | | |
|---|---|---|
| 0 424 608 | 5/1991 | European Pat. Off. . |
| 57-204133 | 12/1982 | Japan . |
| 59-177940 | 2/1985 | Japan . |
| 63-67747 | 3/1988 | Japan . |

OTHER PUBLICATIONS

R.F. Kwasnick et al., "Buried–Oxide Isolation with Etch–Stop (Boxes)," IEEE Electron Device Letters, vol. 9, No. 2, (Feb. 1988), pp. 62–64.

Kurosawa et al., *A New Bird's–Beak Free Field Isolation Technology For VLSI Devices*, International Electron Devices Meeting, Dig. Tech. Paper, pp. 384–387 (1981).

Rung, et al., *Deep Trench Isolated CMOS Devices*, International Electron Devices Meeting, Digest Technical Paper, pp. 237–240 (1982).

Lutze, et al., *Electrical Limitations of Advanced Locos Isolation for Deep Submicrometer CMOS*, IEEE Transactions on Electron Devices, vol. 38, No. 2 pp. 242–245 (Feb., 1991).

Poon, et al., *A Trench Isolation Process for BiCMOS Circuits*, IEEE Bipolar Circuits and Technology Meeting 3.3, pp. 45–48 (1993).

Katsumata, et al., *Sub–20 ps ECL Bipolar Technology with High Breakdown Voltage*, ESSDERC pp. 133–136 (Sep. 1993).

*Primary Examiner*—George Fourson
*Attorney, Agent, or Firm*—Limbach & Limbach L.L.P.

[57] ABSTRACT

An isolation method for separating active regions in a semiconductor substrate by combining field oxide formation with trench isolation is disclosed. Deep trenches are etched in a silicon substrate. An oxide layer is deposited over the entire substrate such that the oxide layer also fills the trenches that have been etched. A layer of polysilicon is deposited over the wafer and etched back to form polysilicon spacers. These polysilicon spacers are used to align a photoresist mask that is used to etch the oxide overlying the active regions of the substrate, thereby resulting in fully planarized isolation regions with fully walled active regions.

12 Claims, 7 Drawing Sheets

% SF6 in C2F6 + SF6
Oxide etch 12% exposed area
Poly-Si etch 0.4% exposed area

METHOD OF FABRICATING A PLANARIZED TRENCH AND FIELD OXIDE ISOLATION STRUCTURE

RELATED APPLICATION

This is a Continuation-In-Part of application Ser. No. 08/212,967 filed by Rashid Bashir et al. on Mar. 15, 1994, abandoned.

FIELD OF THE INVENTION

The present invention relates to electrical isolation of active device regions in an integrated circuit, and, in particular, to a method of fabricating trench oxide isolation structures that provide encroachment-free, planarized field oxide.

BACKGROUND OF THE INVENTION

As the semiconductor industry moves to the manufacturable sub-micron era, the need for a planar sub-micron isolation process is increased. The process should be applicable to high density and high performance CMOS and bipolar processes and should not suffer from the conventional limitations of LOCOS based isolation such as, for example, lateral encroachment and the "bird's beak" effect.

It is well known that individual active device regions on a semiconductor substrate may be electrically isolated from one another using a planar field oxide and a deep trench. Various field oxide isolation schemes have been proposed. However, many of these schemes have problems associated with "bird's beak" and "bird's head" formations. The "bird's beak" formation results from lateral oxidation under the nitride masks used in the standard LOCOS (localized oxidation of silicon) procedure. The "bird's head" formation results from lateral oxidation under the nitride masks used in the recessed or etch back LOCOS procedures. In fact, the walls of the recessed portions adjacent to the nitride masks, according to these procedures, greatly facilitate lateral oxidation. These formations "bird's beak" and "bird's head") encroach upon the active device area, thereby requiring greater distances between devices to compensate for this encroachment.

Various methods have been proposed to overcome this problem. One such method, referred to as "BOX", has been proposed by Kurosawa et al, "A New Bird's-Beak Free Field Isolation Technology for VLSI Devices", International Electron Devices Meeting, Dig. Tech. Paper, pp. 384–387 (1981). The name "BOX" has been given to this method because it involves burying oxide into etched grooves formed in silicon substrates. According to this method, the silicon substrate is etched in the field region using reactive ion etching (RIE) leaving a layer of aluminum covering the active device areas. Then, $SiO_2$ is plasma deposited over the entire substrate. The $SiO_2$ fills up the portion of the substrate previously etched away and also covers the aluminum layer. The plasma-deposited silicon dioxide is then subjected to a lift-off technique using a buffered HF solution. This leaves V-shaped grooves in the periphery of the active region. The silicon dioxide on top of the aluminum mask is lifted off by etching. Next, the remaining V-shaped grooves are buried with silicon dioxide. This is accomplished by chemical vapor deposition (CVD) of silicon dioxide followed by a surface leveling technique using a spin-coated resist. The resist and silicon dioxide layers are simultaneously etched by RIE. The oxide surfaces are then smoothed and any oxide remaining on the active device region is removed by solution etching.

The problem with the BOX method is that it is too complex and cannot be performed efficiently and reliably. A two step oxide burying technique is needed, which is more time consuming than a single oxide deposition step. Furthermore, resist planarization and resist etch-back steps are involved. These steps are difficult to control to close tolerances in a manufacturing environment. Resist planarization and etch-back techniques are not effective and are difficult to achieve for large active areas.

Another trench isolation method is disclosed by Rung et at., "Deep Trench Isolated CMOS Devices," International Electron Devices Meeting, Digest Technical Paper, pp. 237–240. According to this method, trenches are formed by RIE and are filled with silicon dioxide or polysilicon deposited by using low pressure chemical vapor deposition (LPCVD). Once the trenches are filled, a critical etch-back step must be accomplished using end point detection. After the etch back-step, a capping oxidation step is performed using nitride as an oxidation mask.

Yet another method is disclosed by Katsumata et at., "Sub-20 ps ECL Bipolar Technology with High Breakdown Voltage", ESSDERC (September 1993). Katsumata et al. disclose a shallow and deep trench isolation method using Low-Temperature Oxide Filling. According to this method, shallow and deep trenches are etched and then filled with liquid oxide deposition, a technique not yet fully established. A photoresist mask is then formed over the field areas and the exposed portions of the oxide layer are etched. A second step of liquid oxide deposition is then performed, followed by another etch-back step. This process uses a critical alignment step and two liquid oxide deposition and etch-back steps, none of which are easily manufacturable. The above-mentioned problems regarding large active device areas apply to this method as well.

SUMMARY OF THE INVENTION

The present invention is directed toward a novel device isolation scheme that is applicable to high density, high performance CMOS and bi-polar processes, while overcoming the problems associated with the prior art.

The present invention provides an isolation method for separating active regions in a semiconductor substrate by combining field oxide formation with trench isolation. Deeps trenches are etched in a silicon substrate. An oxide layer is formed over the entire substrate to fill the deep trenches. A layer of polysilicon deposited and etched back to form polysilicon spacers. These polysilicon spacers are used to align a photoresist mask that is used to etch the oxide overlying the active regions of the substrate, thereby resulting in fully planarized isolation regions with fully walled active regions.

The oxide filled trenches lower the overall capacitance. No trench planarization is required and no long thermal cycles are needed. The resulting structure has fully-walled junctions and there is no "bird's head" or "bird's beak" formation. Also, significantly, unlike the prior art, the alignment step to etch the oxide over the active regions is very non-critical due to the use of the poly spacers.

A better understanding of the features and advantages of the present invention will be obtained by reference of the following detailed description and accompanying drawings which set forth an illustrative embodiment in which the principles of the invention are utilized.

DETAILED DESCRIPTION OF THE PREFERRED EMBODIMENTS

An isolation scheme according to an embodiment of the present invention will now be discussed in conjunction with FIGS. 1–9.

Figure 1:
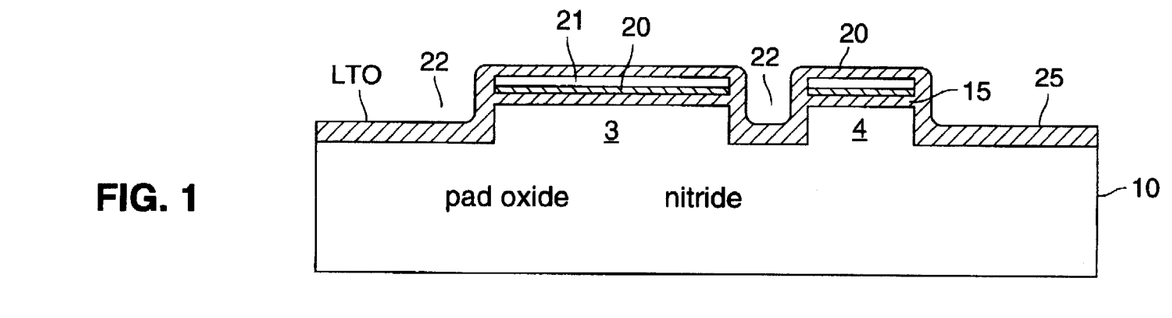
FIGS. 1–9 are cross-section drawings illustrating the steps for fabricating a planarized trench and field oxide isolation structure according to the present invention.

As shown in FIG. 1, a pad oxide layer 15 and a nitride layer 20 are deposited on a silicon substrate 10. The pad oxide layer 15 has a thickness in the range of 300–1000 Angstroms, preferably about 600 Angstroms thick. The nitride layer 20 has a thickness in the range of 1000–2000 Angstroms, preferably about 1000–1300 Angstroms thick. A layer of polysilicon 21 having a thickness of about 1000–3000 Angstroms, and preferably about 2000 Angstroms thick, is then formed on the nitride layer 20. The purpose of the polysilicon layer 21 is to provide an optical end-point while etching oxide deposited later in the process during trench fill.

The polysilicon layer 21, the nitride layer 20, the pad oxide layer 15 and the silicon substrate 10 are then etched using a 2.8 micron photoresist mask (not shown) to form active regions 3 and 4. (Substrate regions, other than active regions 3 and 4, will be referred to as non-active regions.) The etch, can be performed in a LAM 384T etcher, anisotropic and, preferably, extends into the silicon substrate 10 for a depth of about 1.0–1.4 microns to form shallow trenches 22. The etch recipe includes three main steps: a first step that etches the polysilicon layer 21, a second step that etches the nitride layer 20 and the oxide layer 32, and a third step that etches the silicon substrate 10. Etching of the nitride and oxide layers may be performed using suitable chemistries such as $CHF_3+C_2F_6$, $CHF_3+CF_4$, or $CF_4+H_2$ in an RIE (reactive ion etching) system. The polysilicon layer 21 and silicon substrate 10 may be etched using $SF_6+Cl_2$.

Figure 2:
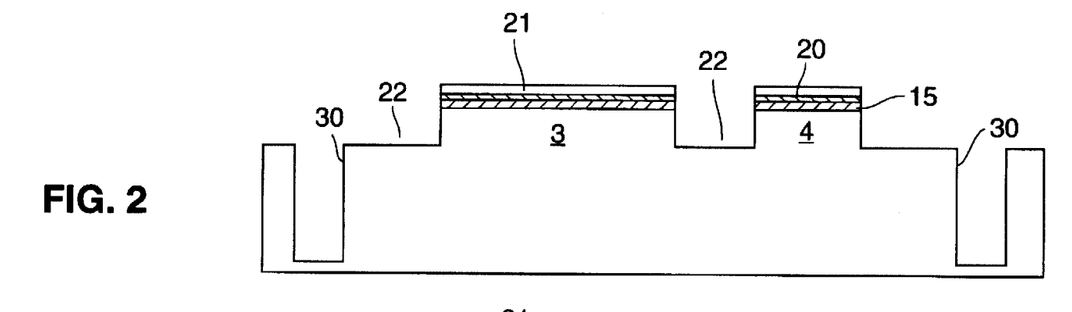

The photoresist mask is then stripped off and a hard mask oxide layer 25 is deposited over the entire substrate 10, serving as a hard mask that will be used for subsequent trench etching. The layer 25 may be low temperature oxide (LTO) or a conformal-deposited oxide such as plasma enhanced TEOS, TEOS/ozone or thermal TEOS oxide. The mask oxide layer 25 is preferably deposited to a thickness of 10,000 Angstroms, but a range of thicknesses between about 7000–13,000 Angstroms is suitable. The oxide layer 25 is then masked and etched to open deep trench windows, thereby forming the hard mask. The etch may be performed in a LAM 384T etcher utilizing suitable chemistries such as $CHF_3+C_2F_6$ or $CHF_3+CF_4$.

Next, deep silicon trenches 30 are etched in a magnetically enhanced RIE system, e.g. an AMAT5000 trench etcher, using the TEOS layer 25 as a mask. The preferred trench width is 1.0 micron and the depth of the trench is determined by the required isolation breakdown voltage. Aspect ratios greater than 10:1 can be achieved using a HBr-based chemistry.

After these deep trenches 30 have been formed, the TEOS layer 25 is etched off using a wet HF-based aqueous solution. Care should be taken in this etch step to ensure that the pad oxide layer 15 does not get undesirably undercut. The resulting structure is shown in FIG. 2. As stated above, the depth of deep trenches 30 is dependent upon the application for which it is to be used and is easily adjustable. As discussed further below, the optimum width of the trench is related to the thickness of the subsequently formed overlying field oxide.

Figure 3:
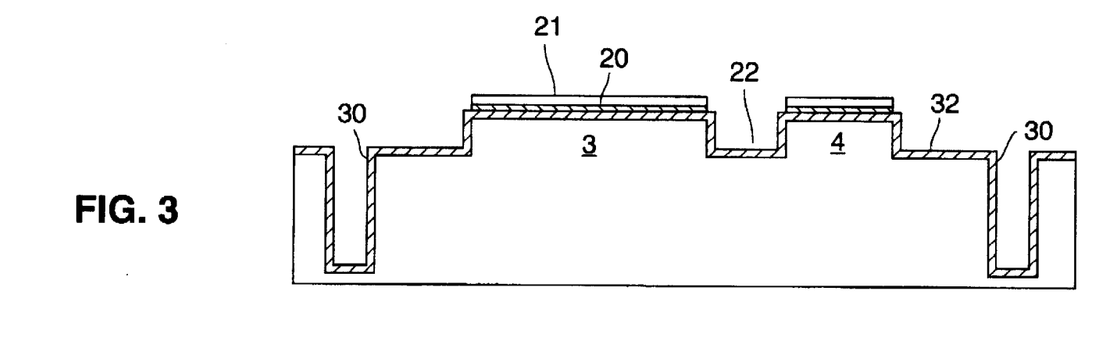

As shown in FIG. 3, a thin sacrificial oxide layer 32 about 600 Angstroms thick is then grown over the FIG. 2 structure at 1050° C. The sacrificial oxide 32 serves to remove any defects that may have occurred due to the reactive ion etching (RIE) of the TEOS hard mask 25. The thin oxide 32 is then stripped off and regrown to passivate the trench sidewall.

Figure 4:
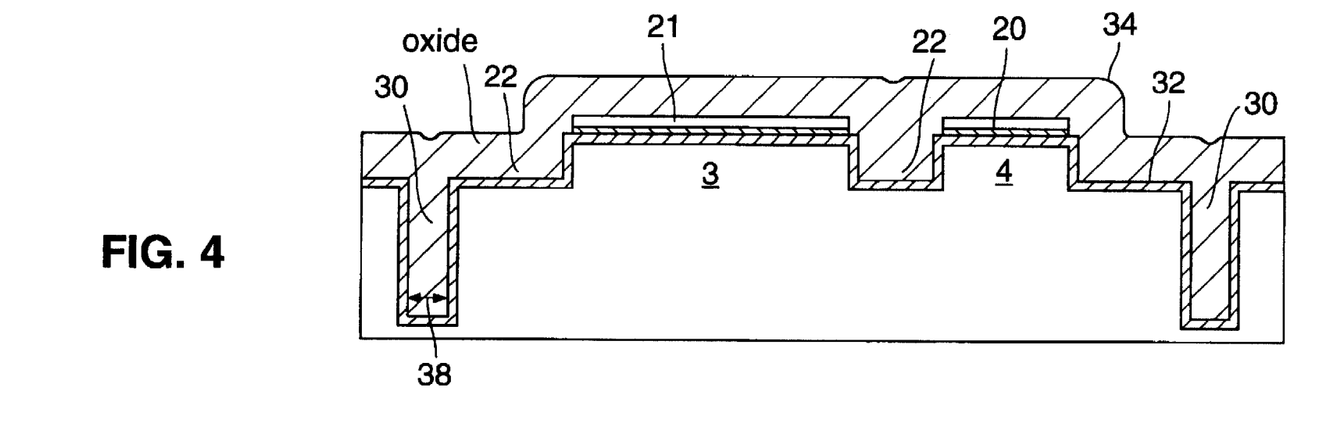

Next, as shown in FIG. 4, a 1.5 micron thick plasma enhanced TEOS (PETEOS) layer 34 is deposited over the entire wafer. The width 38 of trenches 30 should be such that the oxide layer 34 completely fills these trenches. Preferably, the width $W_T$ of the trench 30 should be two times the thickness $T_{fox}$ of the oxide 34 overlying the trench 30. As stated above, a trench width 38 of 1 micron would be suitable. If desired, a thermal cycle at 1050° C. in dry $O_2$ may be used to densify oxide layer 34. The PETEOS film is deposited in an AMAT5000 CVD tool. Even though thermal TEOS is more conformal than PETEOS, PETEOS is preferred since thermal TEOS has higher intrinsic stress and cracks if the film thickness is greater than 5000 Angstroms.

Figure 5:
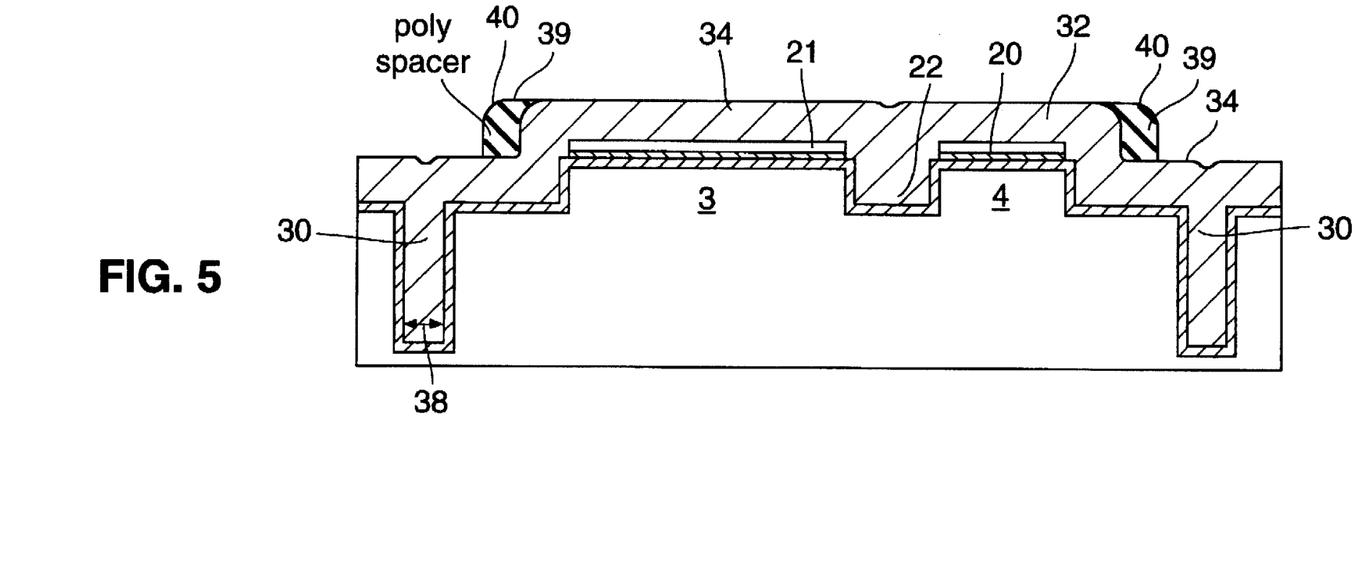

Next, a polysilicon layer is deposited over the wafer and then anisotropically etched back to form polysilicon spacers 40 on the shoulder regions 39 of PETEOS layer 34. Spacers 40 are laterally displaced from the active regions 3 and 4 by a distance approximately equal to the thickness of the oxide layer 34. The polysilicon layer is preferably 2 microns thick, but a range of 1–3 microns is suitable. The etch is stopped on oxide layer 34 utilizing an automatic end point detection scheme. The resulting structure is shown in FIG. 5.

Figure 6:
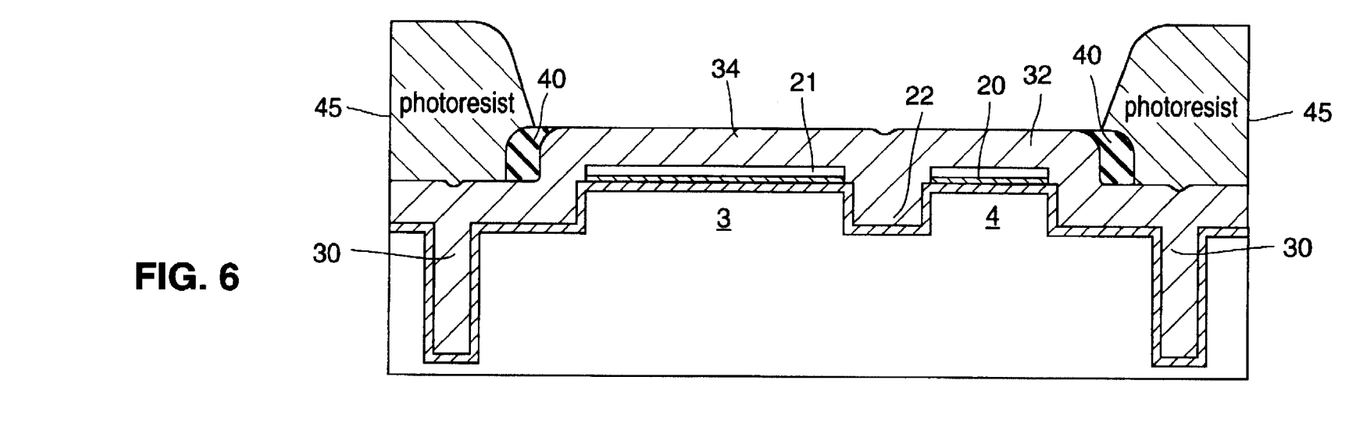

As shown in FIG. 6, a photoresist mask 45 is then aligned within the polysilicon spacers 40. The alignment can be accomplished utilizing a stepper such as the ASM PAS 2500/40 manufactured by ASM Lithography. The width of spacers 40 should be sufficient to tolerate some misalignment of the stepper. The stepper alignment capability should be within 0.1 micrometer. However, this is a non-critical alignment, since the width of the poly spacer 40 is much larger than the alignment tolerance.

The next step is to etch the PETEOS layer 34 to remove oxide from the top of the active areas 3 and 4 using the photoresist and the poly spacers 40 as the mask.

Figure 10:
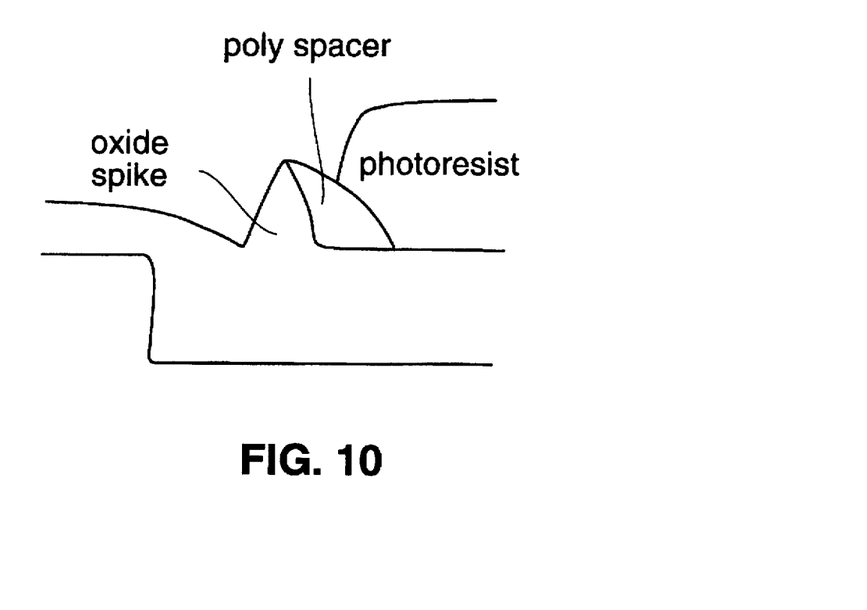
FIG. 10 is a cross-section drawing illustrating formation of an oxide spike due to micromasking of the oxide by a polysilicon spacer.

Various options were explored for the planarization such as wet/dry, all wet and all dry. If a conventional $CHF_3/C_2F_6$ based oxide etch process, which is selective to polysilicon, is used to etch all the oxide 34, then the top edge of the poly spacers 40 will mask the oxide 34 and leave an oxide spike 34' adjacent to the spacers 40, as shown in FIG. 10. An all-wet process is not controllable and does not lend itself to manufacturability.

Figure 11:
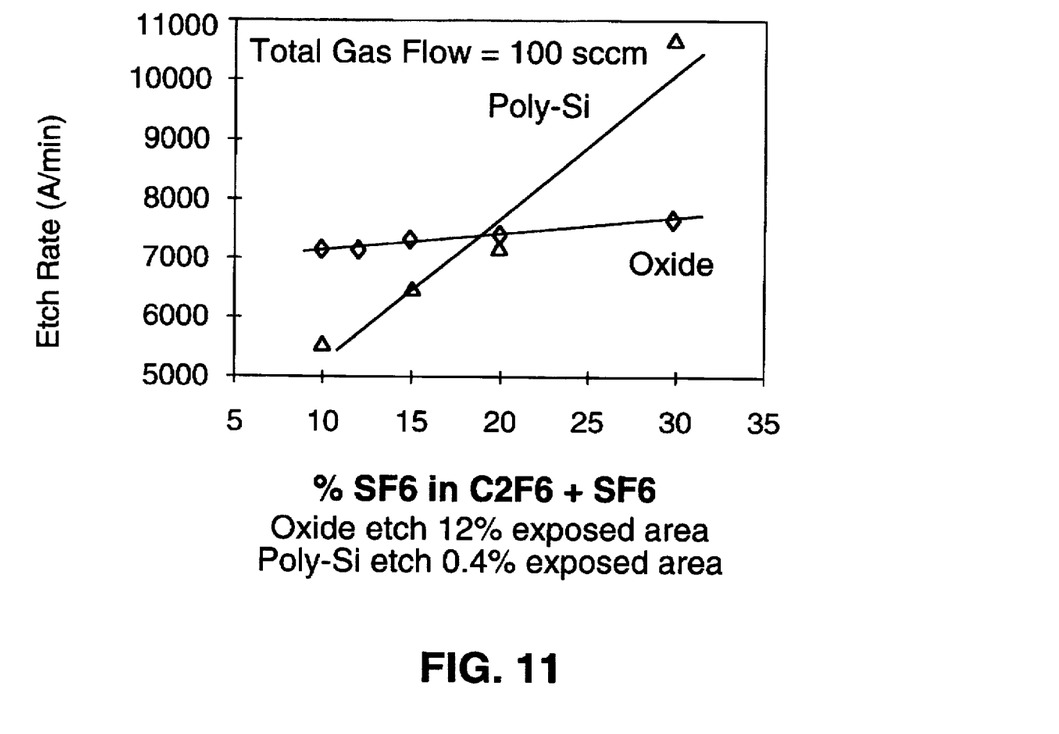
FIG. 11 is a graph plotting variation of oxide and polysilicon etch rate with varying $SF_6$ in $SF_6+C_2F_6$ gas mixture.

The preferred process is a three-step etch. The first step should etch the PETEOS and the top of the poly spacers 40 and, thus, should not be selective to polysilicon. A $C_2F_6$:$SF_6$ based chemistry in a LAM 384T etcher is utilized as an oxide etch non-selective to polysilicon. FIG. 11 shows the etch rates of polysilicon and oxide as the $SF_6$ proportion is changed in the $C_2F_6$:$SF_6$ mixture. As can be seen from FIG.

Figure 7:
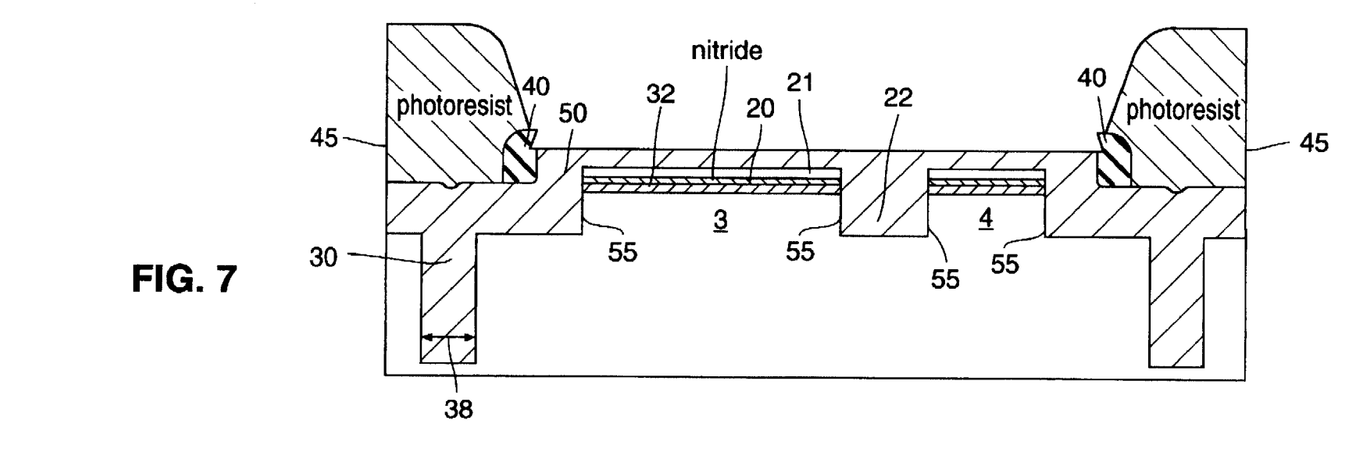
Figure 8:
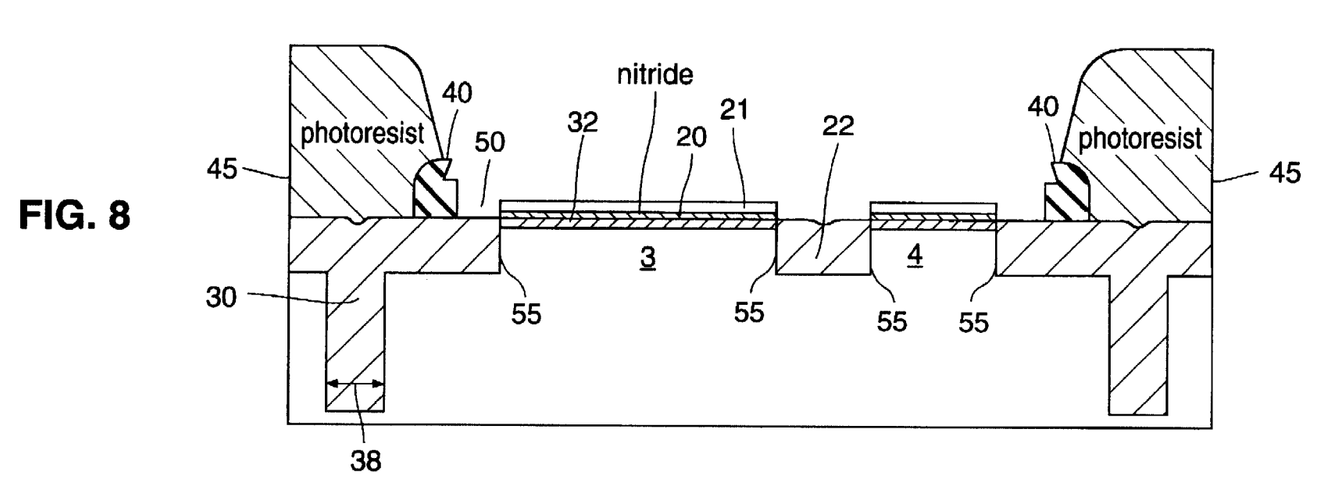
Figure 9:
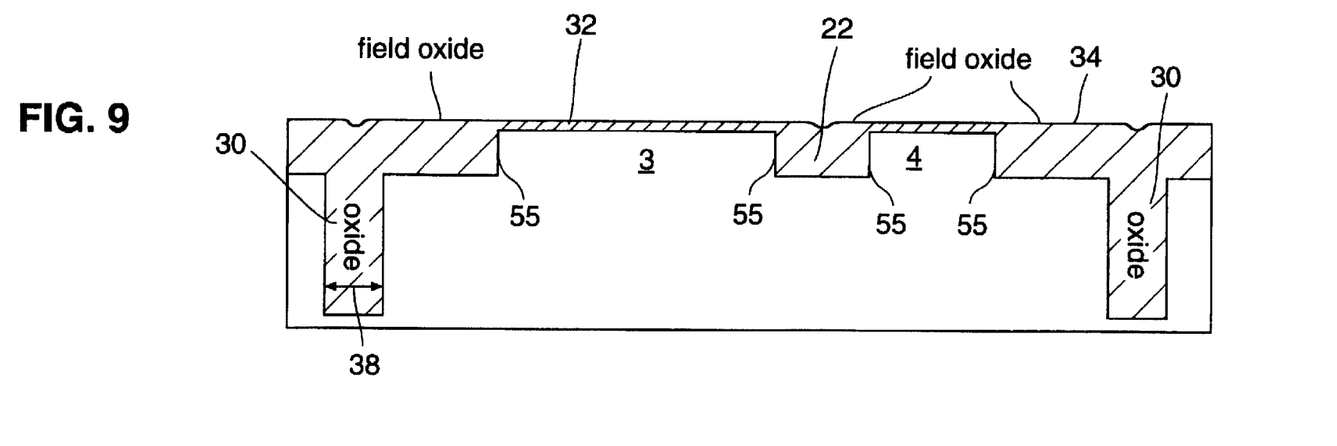

11, the etch rate of the oxide is relatively constant, but the etch rate of the poly can be increased by 2X if the %SF$_6$ is increased from 10% to 30%. As stated above, the first step is necessary to etch the top of the poly spacer 40 to avoid oxide spikes. Thus, the first step is timed and etches about ⅔ of the total thickness of the PETEOS 34, as shown in FIG. 7. Optimization of the C$_2$F$_6$:SF$_6$ ratio to achieve a planar surface resulted in final C$_2$F$_6$:SF$_6$ flows of 90 and 10 seem, respectively.

The second step is an oxide etch step which is very selective to polysilicon and also provides an end-point on the underlying poly layer 21. A conventional CHF$_3$:C$_2$F$_6$ based oxide etch process in a Triode etcher is used, resulting in the structure shown in FIG. 8.

Thermal cycling of the poly layer 21 in the preceding steps causes the poly layer 21 to densify. Thus, in a third step, a timed 20-30 second SF$_6$ etch is utilized to remove the poly1 layer 21 with an end-point on the underlying nitride layer 20.

After the three-step planarization etch is performed, the photoresist is stripped and hot KOH:DI wafer solution at 80° C. is used to remove the remaining poly spacer 40 material. The selectivity of poly:oxide/nitride in the hot KOH solution is greater than 100:1. Subsequently, hot phosphoric is used to strip the nitride layer 20, resulting in the structure shown in FIG. 9, which is ready for further processing.

Figure 12:
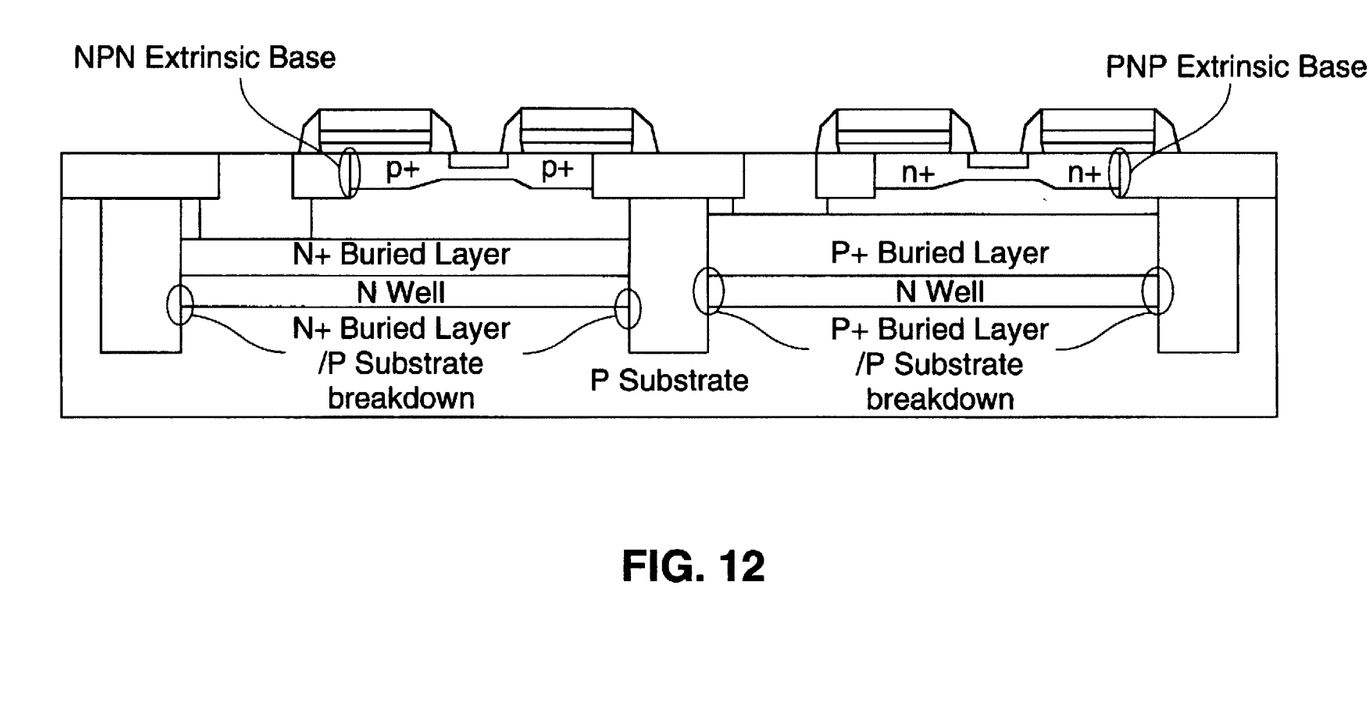
FIG. 12 is a cross-section drawing illustrating vertical NPN and PNP transistors in an isolation structure fabricated in accordance with the present invention.

As shown in FIG. 12, the above-described process can be used for isolating high performance vertical NPN and PNP transistors. The final NPN and PNP extrinsic base junctions are butted against the shallow trench sidewall; the junction breakdowns and leakage should not be limited by the shallow trench sidewall.

Figure 13:
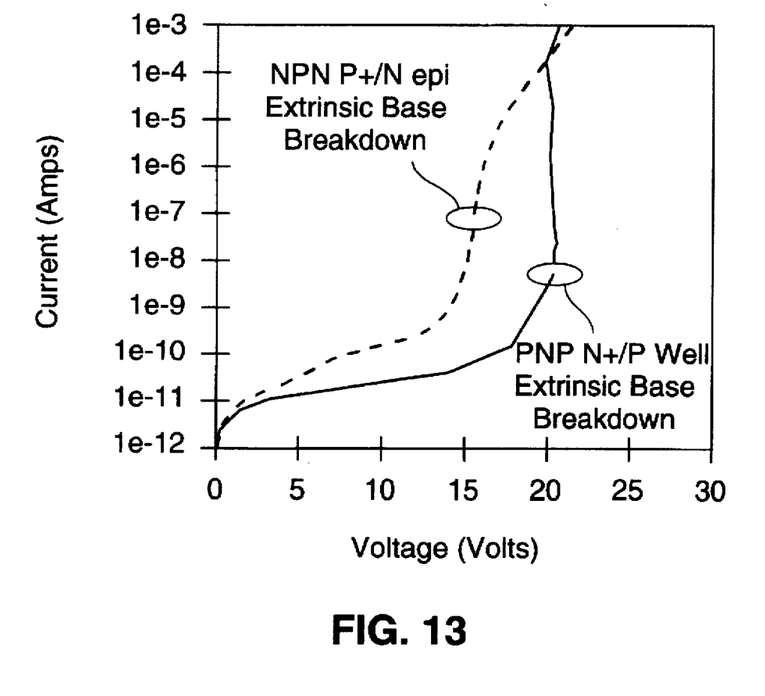
FIG. 13 is a graph illustrating NPN and PNP extrinsic base breakdown curves for the FIG. 12 structure.

FIG. 13 shows the NPN(P+/N Epi) and the PNP (N+/P well) extrinsic base junction leakage and breakdown. The breakdowns are in excess of 18 V and are limited by the reach-through of the depletion layer to the buried layer.

Figure 14:
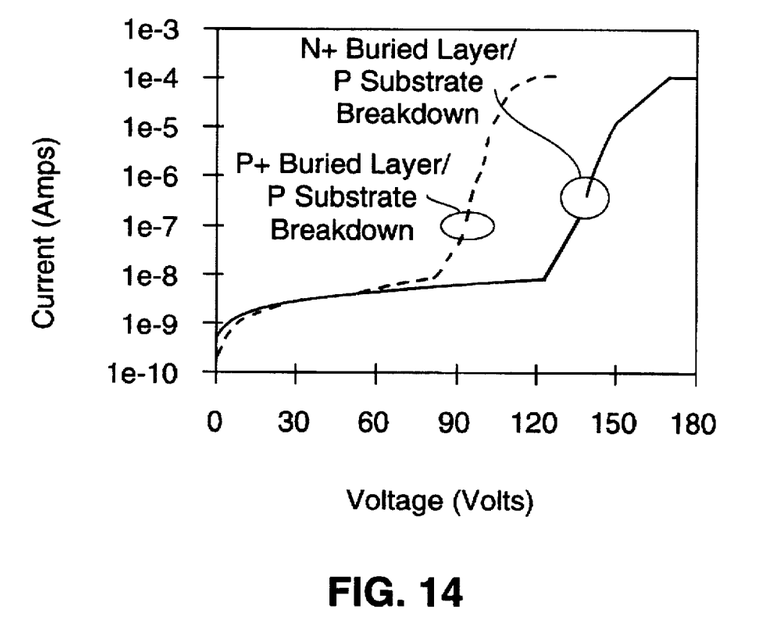
FIG. 14 is a graph illustrating NPN and PNP substrate isolation breakdown curves for the FIG. 12 structure.

FIG. 14 shows the NPN N well to P-substrate junction leakage and breakdown voltages. As shown in FIG. 13, both breakdowns are in excess of 80 V, indicating defect-free sidewalls and junctions.

While the present invention has been disclosed above with particular reference to the preferred embodiments shown, those embodiments are presented by way of example, not by way of limitation. Those of ordinary skill in the art would be enabled by this disclosure to add or to modify these embodiments of the invention in various ways as needed and still be within the scope and spirit of the present invention as recited in the appended claims.

For example, alternatively, the above-described process can be performed without deep trenches 30. The result would be planar, fully-walled oxide isolation regions which completely eliminate the undesirable "bird's beak" phenomenon. Also, trench isolation using other more conventional process flows can be performed after the formation of the planar field oxide isolation.

Furthermore, formation of etch-stop polysilicon layer 21 may be eliminated from the process flow. In this case, the isolation oxide layer 34 is etched anisotropically in a single etch step utilizing an etch chemistry that is selective to polysilicon and nitride (the nitride in this case having been formed to a thickness of 1000-3000 Angstroms) and an automatic end point detection scheme.

What is claimed is:

1. A method of fabricating electrically isolated active regions in a silicon substrate by combining field oxide and trench isolation techniques, the method comprising:

forming a pad oxide layer on a surface of the substrate;

forming a nitride layer on the pad oxide layer;

forming an etch-stop polysilicon layer on the nitride layer;

selectively etching the etch-stop polysilicon layer, the nitride layer and the pad oxide layer to expose spaced-apart non-active surface regions of the silicon substrate, the non-active surface regions defining the active regions therebetween;

etching the non-active surface regions of the silicon substrate to form first trenches having a first depth in the silicon substrate;

forming a mask oxide layer over the structure resulting from the foregoing steps and patterning the mask oxide layer to expose bottom surface regions of selected ones of the first trenches;

etching the bottom surface regions to form second trenches having a second depth that is deeper than the first depth in the silicon substrate;

removing the mask oxide layer;

forming a sidewall oxide layer on exposed bottom and sidewall surfaces of the first trenches and the second trenches;

forming an isolation oxide layer over the structure resulting from the foregoing steps;

forming polysilicon spacers on the isolation oxide layer adjacent to edges of the active regions;

forming an oxide etch mask on the structure resulting from the foregoing steps, the oxide etch mask having openings therein over the active regions to expose the isolation oxide layer over the active regions, edges of the openings being formed on the polysilicon spacers;

removing the isolation oxide layer from the active regions using the oxide etch mask as a mask;

removing the etch-stop polysilicon layer; and removing the polysilicon spacers and the nitride layer.

2. A method as in claim 1 wherein the step of removing the isolation oxide layer comprises:

etching a portion of the thickness of the isolation oxide layer utilizing a first etch chemistry; and etching the remainder of the thickness of the isolation oxide layer utilizing a second etch chemistry.

3. A method as in claim 1 wherein the step of removing the isolation oxide layer comprises:

etching a portion of the thickness of the isolation oxide layer utilizing a first etch chemistry that is non-selective to polysilicon; and etching the remainder of the thickness of the isolation oxide layer utilizing a second etch chemistry that is selective to polysilicon.

4. A method as in claim 1 wherein the step of removing the isolation oxide layer comprises:

etching a portion of the thickness of the isolation oxide layer utilizing a first etch chemistry that includes a C$_2$F$_6$:SF$_6$ mixture; and etching the remainder of the thickness of the isolation oxide layer utilizing a second etch chemistry that is selective to polysilicon.

5. A method as in claim 4 wherein the second etch chemistry includes a CHF$_3$:C$_2$F$_6$ mixture.

6. A method as in claim 1 wherein the mask oxide layer is low temperature oxide (LTO).

7. A method as in claim 1 and wherein the mask oxide layer is conformed deposited oxide selected from the group consisting of plasma enhanced TEOS (PETEOS), TEOS/ OZONE and thermal TEOS oxide.

8. A method as in claim 1 wherein the nitride layer is about 1000 Angstroms thick and the etch-step polysilicon layer is about 3000 Angstroms thick.

9. A method as in claim 1 wherein the etch-stop polysilicon layer is removed by etching with $SF_6$.

10. A method of fabricating electrically isolated active regions in a silicon substrate by combining field oxide and trench isolation techniques, the method comprising;

forming a pad oxide layer on a surface of the substrate;

forming a nitride layer on the pad oxide layer;

selectively etching the nitride layer and the pad oxide layer to expose spaced-apart non-active surface regions of the silicon substrate, the non-active surface regions defining the active regions therebetween;

etching the non-active surface regions of the silicon substrate to form first trenches having a first depth in the silicon substrate;

forming a mask oxide layer over the structure resulting from the foregoing steps and patterning the mask oxide layer to expose bottom surface regions of selected ones of the first trenches;

etching the bottom surface regions to form second trenches having a second depth that is greater than the first depth in the silicon substrate;

removing the mask oxide layer;

forming a sidewall oxide layer on exposed bottom and sidewall surfaces of the first trenches and the second trenches;

forming an isolation oxide layer over the structure resulting from the foregoing steps;

forming polysilicon spacers on the isolation oxide layer adjacent to edges of the active regions;

forming an oxide etch mask on the structure resulting from the foregoing steps, the oxide etch mask having openings therein over the active regions to expose the isolation oxide layer over the active regions, edges of the openings being formed on the polysilicon spacers;

removing the isolation oxide layer from the active regions using the oxide etch mask as a mask; and removing the polysilicon spacers and the nitride layer.

11. A method as in claim 10 and wherein the mask oxide layer is conformed deposited oxide selected from the group consisting of plasma enhanced TEOS (PETEOS), TEOS/ OZONE and thermal TEOS oxide.

12. A method as in claim 10 wherein the nitride layer is about 1000–3000 Angstroms thick.

* * * * *